United States Patent
Oh et al.

(10) Patent No.: US 8,142,240 B2
(45) Date of Patent: Mar. 27, 2012

(54) LEAD PIN FOR PACKAGE SUBSTRATE

(75) Inventors: Heung Jae Oh, Suwon-si (KR); Ki Taek Lee, Seoul (KR); Dong Gyu Lee, Suwon-si (KR); Sung Won Jeong, Yongin-si (KR); Jin Won Choi, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/805,214

(22) Filed: Jul. 19, 2010

(65) Prior Publication Data

US 2011/0014827 A1 Jan. 20, 2011

(30) Foreign Application Priority Data

Jul. 20, 2009 (KR) .................. 10-2009-0066089

(51) Int. Cl.
*H01R 4/02* (2006.01)

(52) U.S. Cl. .................................... 439/876; 439/83

(58) Field of Classification Search .................. 439/83, 439/876, 884; 174/44 R, 267; 257/697
See application file for complete search history.

(56) References Cited

U.S. PATENT DOCUMENTS

| | | | | |
|---|---|---|---|---|
| 6,300,678 | B1 * | 10/2001 | Suehiro et al. | 257/697 |
| 6,359,332 | B2 * | 3/2002 | Shiraishi | 257/697 |
| 6,438,830 | B1 * | 8/2002 | Dibble et al. | 29/876 |
| 6,623,283 | B1 * | 9/2003 | Torigian et al. | 439/83 |
| 7,393,217 | B2 * | 7/2008 | Huang et al. | 439/83 |
| 7,485,017 | B2 * | 2/2009 | Pang et al. | 439/876 |
| 7,723,620 | B2 * | 5/2010 | Kawade et al. | 174/267 |
| 7,893,355 | B2 * | 2/2011 | Oh et al. | 174/94 R |
| 2008/0009155 | A1 * | 1/2008 | Ide et al. | 439/83 |
| 2010/0000761 | A1 * | 1/2010 | Oh et al. | 174/126.1 |
| 2011/0014826 | A1 * | 1/2011 | Lee et al. | 439/884 |
| 2011/0014827 | A1 * | 1/2011 | Oh et al. | 439/884 |
| 2011/0067899 | A1 * | 3/2011 | Choi et al. | 174/126.1 |
| 2011/0068473 | A1 * | 3/2011 | Lee et al. | 257/773 |
| 2011/0127676 | A1 * | 6/2011 | Choi et al. | 257/773 |

FOREIGN PATENT DOCUMENTS

| JP | 05029526 A | * | 2/1993 |
|---|---|---|---|
| JP | 06132450 A | * | 5/1994 |

* cited by examiner

Primary Examiner — James Harvey

(57) ABSTRACT

Disclosed herein is a lead pin for a package substrate. The lead pin for the package substrate includes a cylindrical connection pin; and a head part that is formed on one end of the connection pin and has a convex round part formed on the lower end of the head part, having a step part. When the lead pin for the package substrate is mounted on the package substrate, the bulge phenomenon of a solder paste that surrounds the head part and is melted is prevented by a flange part, thereby making it possible to prevent the connection pin from being polluted and to improve a contact defect such as a short defect or the like when coupling a socket.

2 Claims, 5 Drawing Sheets

[FIG. 1]
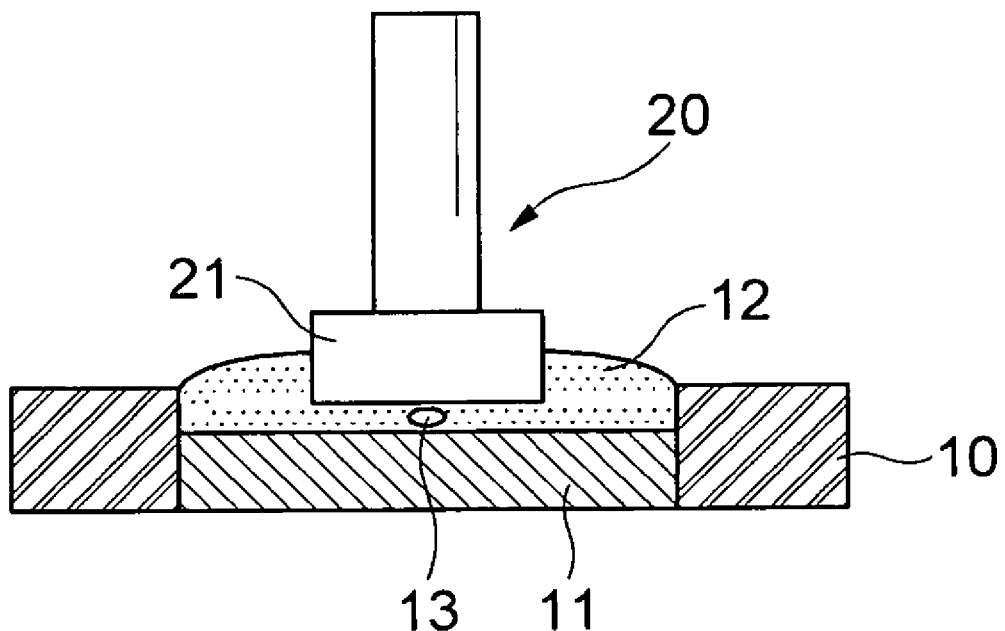
[FIG. 2]
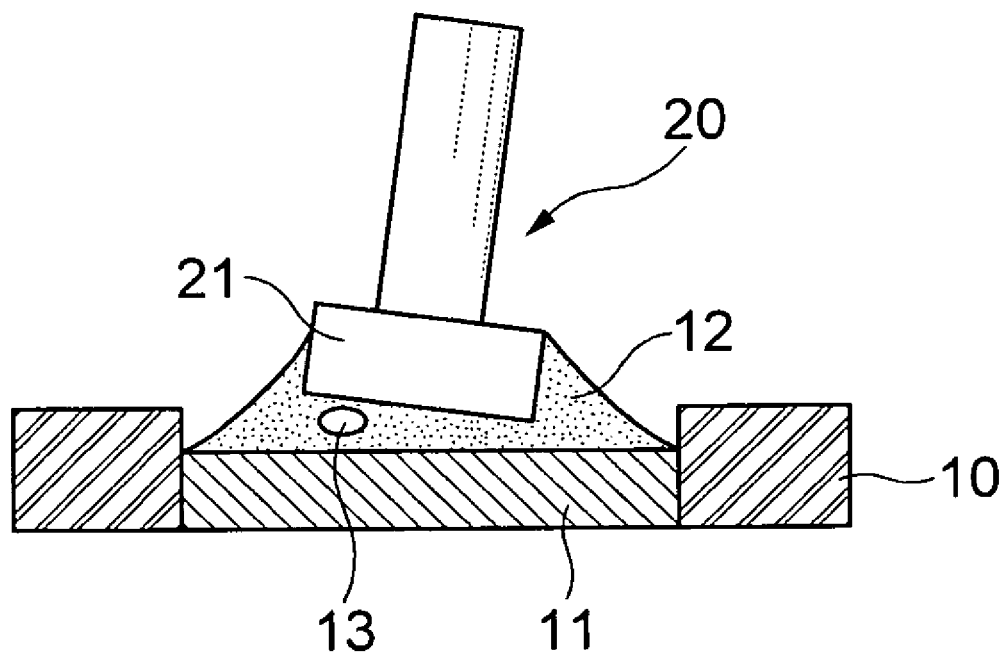

[FIG. 3]
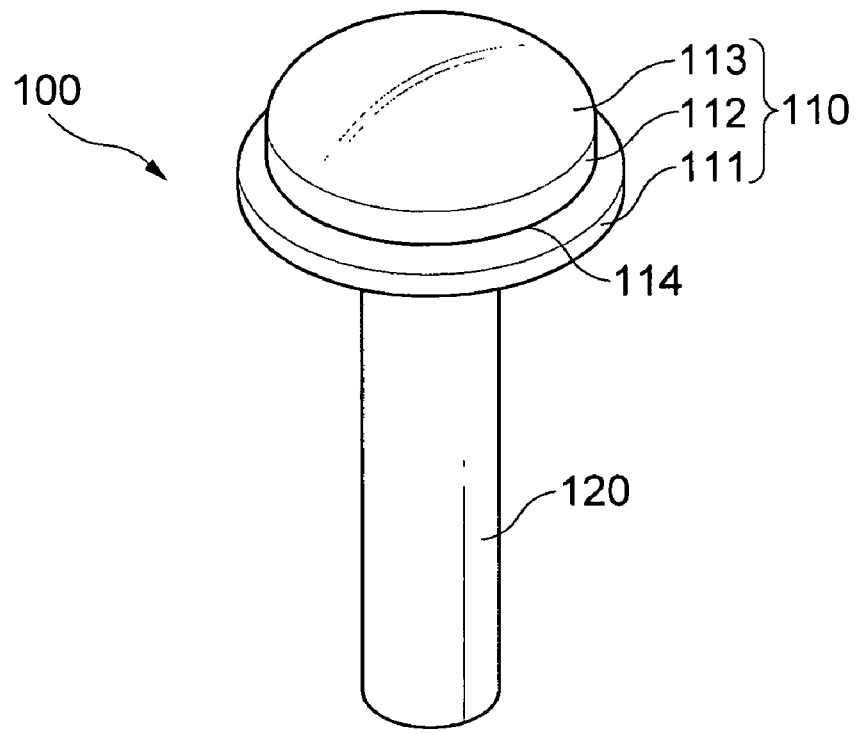
[FIG. 4]
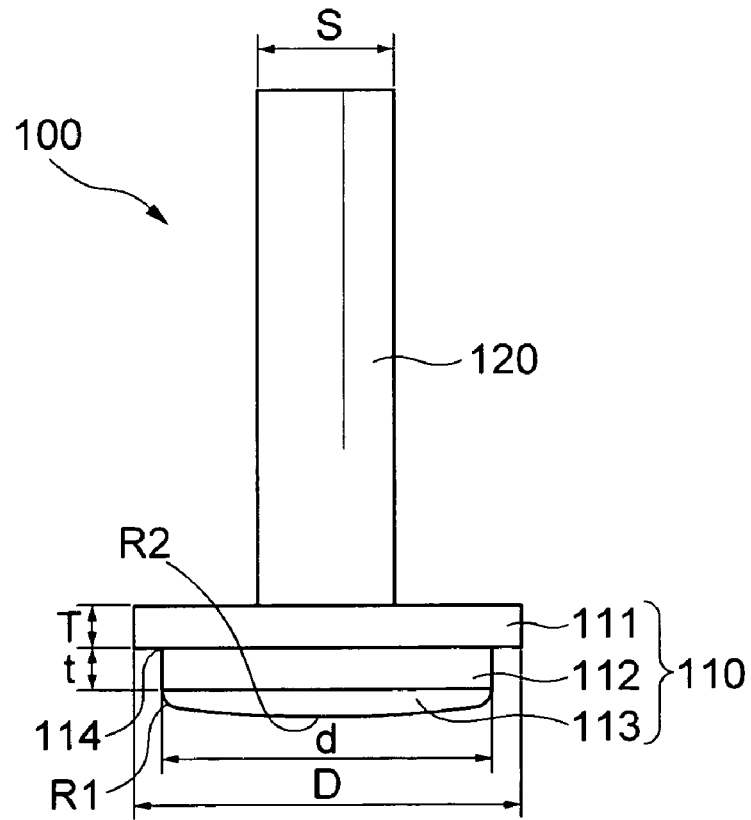

【FIG. 5】
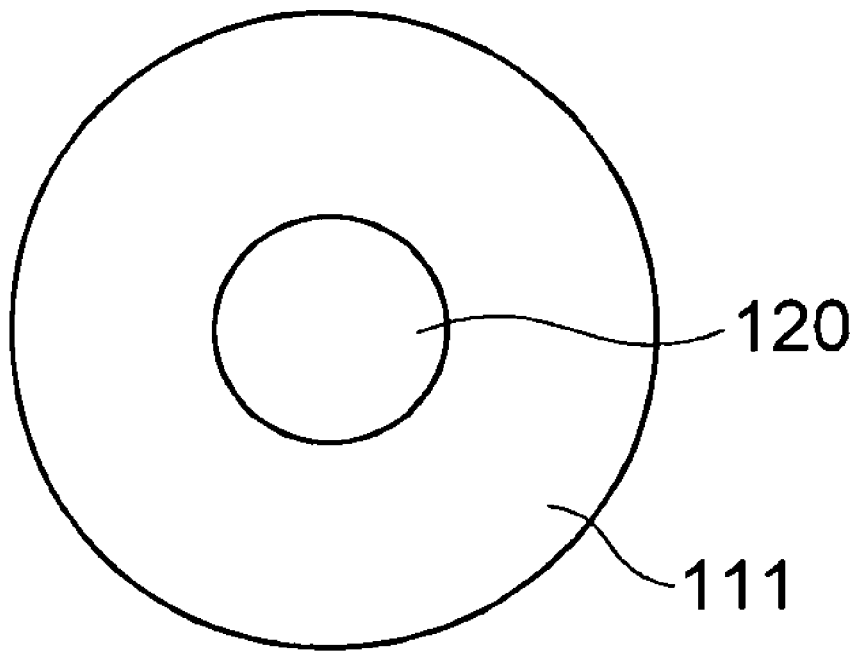
【FIG. 6】
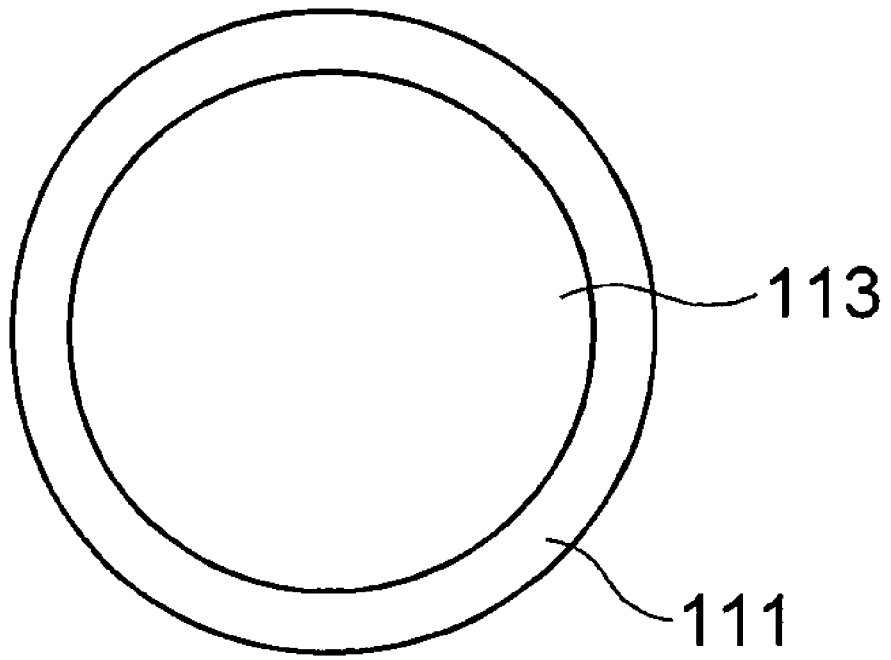

[FIG. 7]
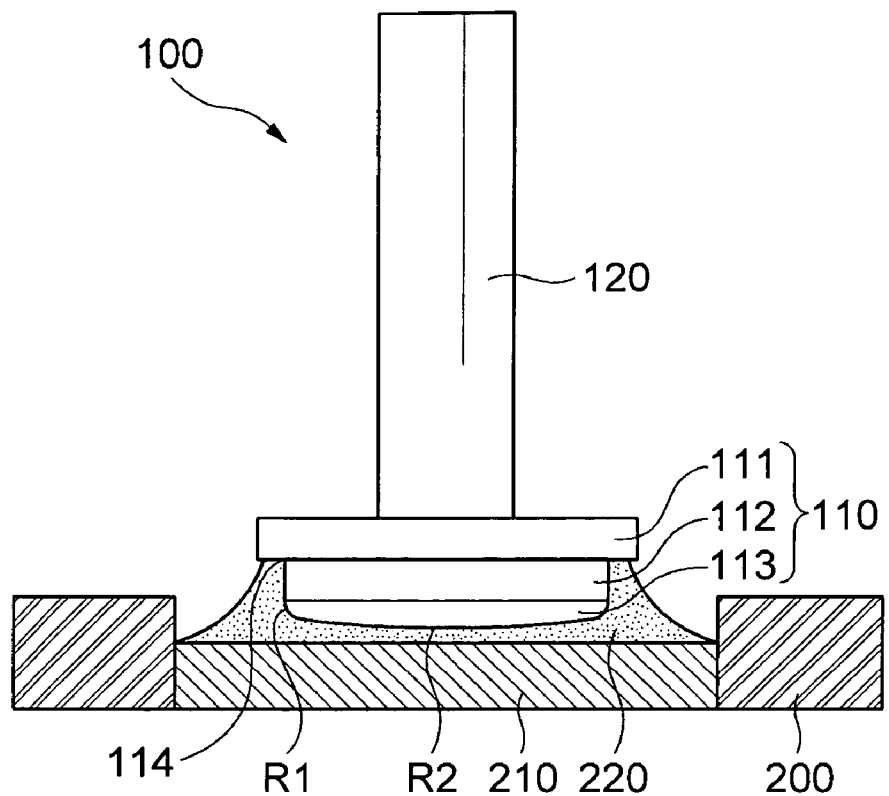
[FIG. 8]
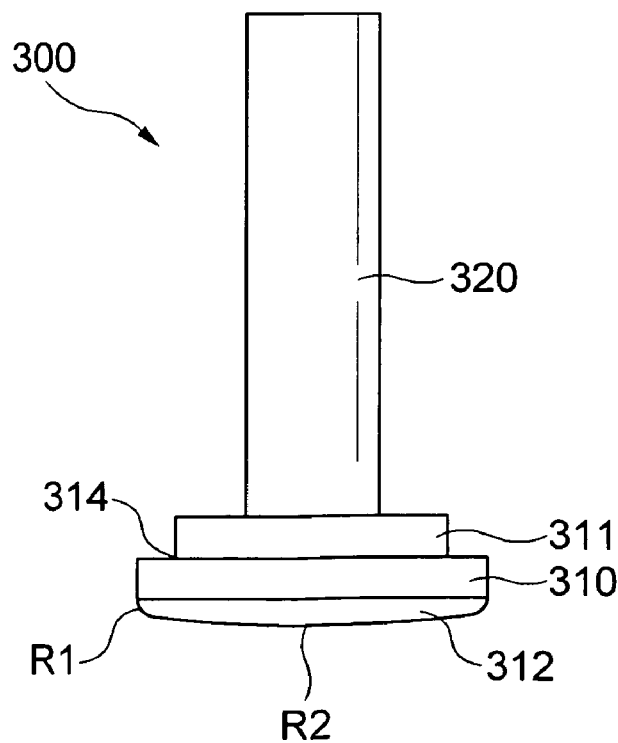

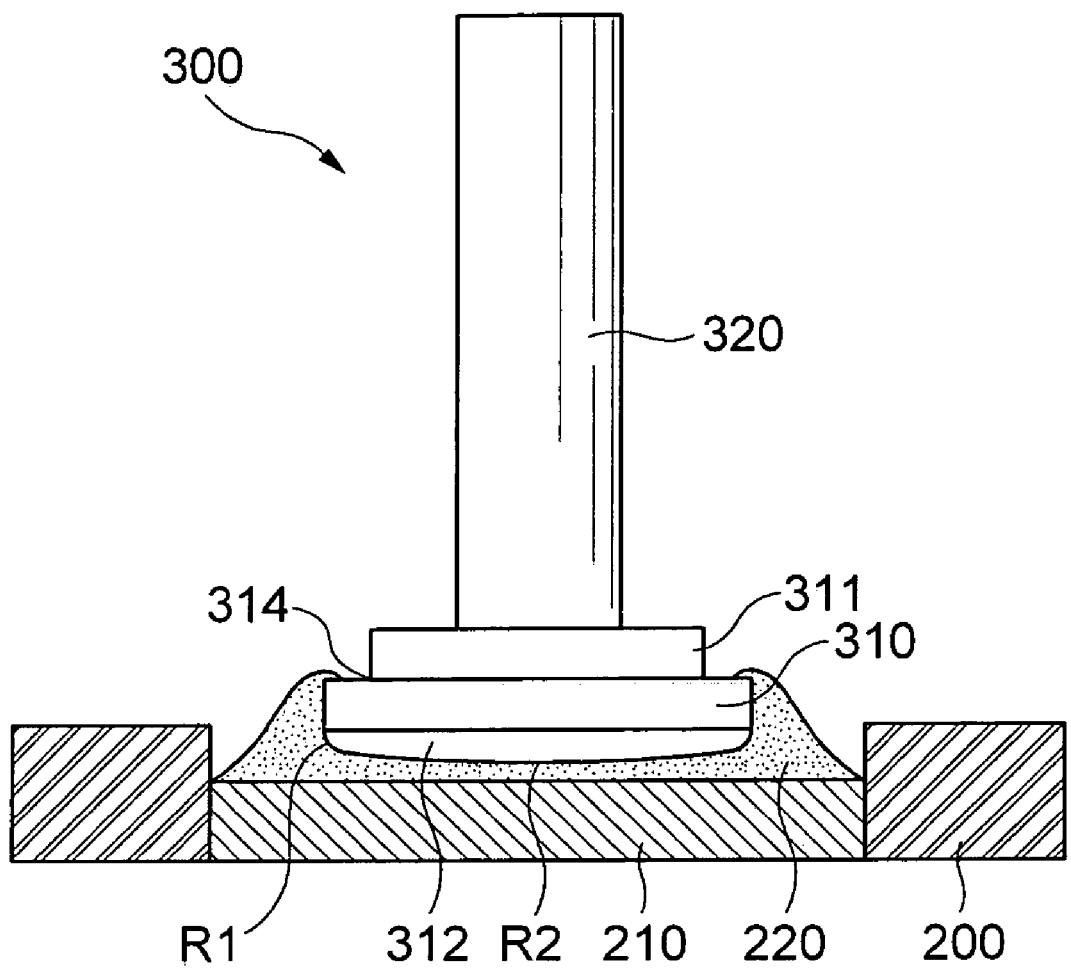
[FIG. 9]

LEAD PIN FOR PACKAGE SUBSTRATE

CROSS REFERENCE TO RELATED APPLICATION

This application claims the benefit of Korean Patent Application No. 10-2009-0066089, filed on Jul. 20, 2009, entitled "Lead Pin for Package Substrate", which is hereby incorporated by reference in its entirety into this application.

BACKGROUND OF THE INVENTION

1. Technical Field

The present invention relates to a lead pin for a package substrate, and more particularly, to a lead pin for a package substrate that includes a head part that has a round part formed on the lower end thereof, having a step part, and a connection pin that is vertically projected from the head pin.

2. Description of the Related Art

With the development of the electronics industry, various types of semiconductor packages have been manufactured. Recently, due to the increase in wiring density of a semiconductor package, a semiconductor package substrate in a Pin Grid Array (PGA) type in which a plurality of T-type lead pins are mounted has been widely used as a substrate that connects a package substrate on which an integrated circuit (IC) is mounted to a main board.

In a general package substrate, a pin insert type that a pin is inserted through a hole and a T-type lead pin that is attached to a package substrate by a soldering have been mainly used. The T-type lead pin has gradually become widespread due to limitation of the available area for the circuit configuration of the package substrate as compared to the pin insert type.

However, the T-type lead pin has disadvantages in that the lead pin is inclined and it is difficult to maintain uniform bonding strength when being mounted on the package substrate. In particular, as the use of lead has been recently limited in consideration of environmental effects due to the soldering, a soldering (Sn—Ag—Cu, and Sn—Sb) not using lead has been used, such that a melting temperature of the soldering becomes high.

As the melting temperature for soldering becomes high, a soldering for connecting lead pins that support lead pins is melted by reflow heat during a reflow process for mounting an IC chip on a package substrate, thereby causing inclination of the lead pins.

For example, several hundreds of lead pins mounted on a semiconductor are used in a CPU package substrate. If any one of them is inclined, the CPU itself cannot be mounted on a socket, such that the package substrate itself is regarded as a defective product.

Further, there is a possibility that voids are formed between the head part of the lead pin and a soldering when soldering the T-type lead pin according to the related art in addition to the inclination of the lead pin. Therefore, problems according to the related art will be described with reference to the accompanying drawings.

FIGS. 1 and 2 are configuration diagrams showing a bonding state of a lead pin according to the related art. As shown in FIGS. 1 and 2, after a solder paste 12 is applied to a pad part 11 of a package substrate 10, a lead pin 20 is mounted on the pad part 11 of the package substrate 10 so that the head part 21 of the lead pin 20 contacts the pad part 11 thereof.

Thereafter, when the plurality of lead pins 20 are mounted on the pad part 11 of the package substrate 10, a reflow process for mounting an IC chip on the package substrate 10 is performed and the IC chip is mounted and the plurality of lead pins 20 are coupled on the package substrate 10 by the reflow process.

However, when applying the solder paste 12 in order to bond the lead pins 20, bonding strength of the lead pins 20 may be degraded due to voids 13 generated in the solder paste 12. Further, the lead pins 20 may incline to one side of the lead pin 20 depending on the size of the void 13.

In addition, the solder paste (Sn95-Sb5, melting point 232 to 240° C.) for coupling the lead pins 20 has a higher melting point as compared to the solder paste (Sn96-Ag3.5-X solder, melting point 221° C.) for coupling the IC chips. However, in order to minimize thermal impact that is applied to the package substrate 10 during the reflow process, the heating time at the temperature of the melting point or more is controlled to be short, such that there is insufficient time to remove the voids 13 in the soldering. As a result, the melted surface of the solder paste 12 itself does not become uniform or tension with the lead pins 20 is generated due to the expansion of the voids 13, such that a bonding defect is caused due to the inclination of the lead pin 20 to one side.

Although not shown in FIGS. 1 and 2, the solder paste 12 applied to the pad part 11 of the package substrate 10 bulges along the upper portion of the head part 21 of the lead pin 20 due to high-temperature melting during the reflow process, such that the solder paste 12 directly contacts the pad of the socket when mounting the socket, thereby causing a short defect.

SUMMARY OF THE INVENTION

Therefore, the present invention is provided to solve the disadvantages and problems of the lead pin according to the related art. The present invention has been made in an effort to provide a lead pin for a package substrate that includes a head part that is formed in a disk shape and has a round part formed on the lower end of the head part, having a step part, and a connection pin that is projected from the head part, to prevent the connection pin from being polluted by a melted solder paste and to allow voids in the solder paste to be easily discharged through the curved surface of the round part.

An object of the present invention is to provide a lead pin for a package substrate, including: a cylindrical connection pin; and a head part that is formed on one end of the connection pin and has a round part formed on the lower end of the head part, having a step part.

At this time, the head part may include a flat part that has a round part formed on the bottom surface of the flat part and a flange part that has a larger diameter than that of the flat part, and the step part is formed at the portion in which the side surface of the flat part is connected to the bottom surface of the flange part.

The cylindrical connection pin is vertically projected from the center portion of one surface of the flange part and the flat part that has a larger diameter than that of the connection pin and has the round part formed on the bottom surface of the flat part is projected from the other surface of the flange part.

At this time, the flat part may have a diameter ratio of 1:0.5 to 1:0.98 with respect to a diameter of the flange part.

Further, the head part has the flange part formed in a disk shape and the flat part that is projected from the other surface of the flange part, having different thicknesses, preferably, the flat part having a thickness thicker than that of the flange part.

Further, the flat part may have a diameter ratio of 1:1.1 to 1:4 with respect to a diameter of the connection pin, most preferably, a diameter ratio of 1:2.4 in consideration of the contact area with the bottom surface of the flat part.

Further, the round part formed on the bottom surface of the flat part has an outer circumferential surface which has two different radii of curvature, and has a radius of curvature of 1:0.1 to 1:5 with respect to the diameter of the connection pin in order that voids in the solder paste contacting the outer circumferential surface can be discharged along the curved surface.

At this time, two radii of curvature formed on the round part may be the same.

Another object of the present invention is to provide a lead pin for a package substrate, including: a cylindrical connection pin; and a head part that is formed on one end of the connection pin and has a step part formed on the top surface of the head part and a round part formed on the bottom surface of the head part.

The head part is formed on one end of the connection pin in a disk shape, the top surface of the head part is formed with the flat part having a diameter smaller than that of the head part, and the bottom surface of the head part is formed with the round part having a predetermined radius of curvature.

At this time, the flat part has a diameter ratio of 1:1.1 to 1:4 with respect to a diameter of the head part.

Further, the round part formed on the bottom surface of the head part has an outer circumferential surface which has two different radii of curvature, which are selected from the range of 1:0.1 to 1:5 in order that voids in the solder paste contacting the outer circumferential surface can be discharged along the curved surface.

At this time, two radii of curvature forming the curved surface of the round part may be the same.

BRIEF DESCRIPTION OF THE DRAWINGS

FIGS. 1 and 2 are configuration diagrams showing a bonding state of a lead pin according to the related art;

FIG. 3 is a bottom perspective view of a lead pin for a package substrate according to the present invention;

FIG. 4 is a side view of a lead pin for a package substrate according to the present invention;

FIGS. 5 and 6 are a plan view and a bottom view of a lead pin for a package substrate according to the present invention;

FIG. 7 is a side cross-sectional view showing a configuration where a lead pin according to the present invention is mounted on a package substrate;

FIG. 8 is a side view of a lead pin for a package substrate according to another embodiment of the present invention; and FIG. 9 is a side cross-sectional view showing a configuration where a lead pin according to another embodiment of the present invention is mounted on a package substrate.

DESCRIPTION OF THE PREFERRED EMBODIMENTS

The acting effects and technical configuration with respect to the objects of a lead pin for a package substrate according to the present invention will be clearly understood by the following description in which exemplary embodiments of the present invention are described with reference to the accompanying drawings.

First, FIG. 3 is a bottom perspective view of a lead pin for a package substrate according to the present invention, FIG. 4 is a side view of a lead pin for a package substrate according to the present invention, and FIGS. 5 and 6 are a plan view and a bottom view of a lead pin for a package substrate according to the present invention.

Further, FIG. 7 is a side cross-sectional view showing a configuration where a lead pin according to the present invention is mounted on a package substrate.

As shown in the drawings, a lead pin for the package substrate 100 according to the present embodiment is configured to include a head part 110 that is mounted on a pad part 210 of a package substrate 200 and a connection pin 120 that is vertically installed through the head part 110.

The connection pin 120 is a portion that is inserted into a socket or the like when the lead pin 100 is mounted on the package substrate 200. The connection pin 120 is formed in a cylindrical shape having a predetermined length according to the type of the package substrate 200 and is coupled so that it is projected to the upper portion of the package substrate 200 when the lead pin 100 is mounted.

In addition, the head part 110 is provided with a flange part 111 that is formed in a disk shape on one end of the connection pin 120, a flat part 112 that is projected from the bottom surface of the flange part 111, having a step part 114, and a round part 113 that is formed in a convex type on the bottom surface of the flat part 112, having two different radii of curvature R1 and R2.

At this time, the step part 114 is formed due to the difference in diameters of the disk shaped flange part 111 and the flat part 112 that are formed on one end of the connection pin 120, having different diameters.

In other words, the diameter D of the flange part 111 that is formed on one end of the connection pin 120 is larger than the diameter d of the flat part 112 in a disk shape that is projected from the bottom surface of the flange part 111, such that the step part 114 is formed on the portion where the side surface of the flat part 112 is connected to the bottom surface of the flange part 111.

When the lead pin 100 is mounted on a pad part 210 of the package substrate 200, a solder paste 220 is introduced into the step part 114. And, a bulge phenomenon that the solder paste 220 bulges along the surface of the connection pin 120 is prevented by the flange part 111 that constitutes the step part 114. In other words, the flange part 111 functions as a stopper for the bulge phenomenon of the solder paste 220.

It is preferable that the diameter d of the flat part 112 has a diameter ratio of 1:0.5 to 1:0.98 with respect to the diameter D of the flange part 111 that is positioned on the upper portion of the flat part 112. Herein, when the diameter ratio of the flat part 112 and the flange part 111 is 1:0.5 or less, an area where the bottom surface of the flat part 112 contacts the pad part 210 of the package substrate 200 becomes small so that the connection pin may be mounted to be inclined as in the related art. Further, it may degrade the effects of suppressing the generation of voids that may be generated from the contact points with the solder paste during the bonding process through a reflow process after the flat part 112 is vertically mounted on the solder paste 220. In addition, when external force is applied to the connection pin 120 after the reflow process, stress that may be transferred through the solder paste 220 is concentrated only on some points, such that the connection pin 120 may be easily broken or damaged due to fatigue load.

In addition, when the diameter ratio of the flat part 112 and the flange part 111 is 1:0.98 or more, the step part 114 has an extremely narrow width, the flange part 111 cannot properly function as the stopper for the melted solder paste 220. Therefore, the effects to prevent the bulge phenomenon that the solder paste bulges along the connection pin 120 are degraded. Further, the area where the step part 114 as well as the side surface of the flat part 112 are bonded to the solder paste 220 is reduced and thus the solder paste 220 can be bonded to only the end side of the round part 113 that is formed on the flat part 112, such that bonding strength with the solder paste is significantly degraded.

Therefore, based on the reasons as described above, it is preferable that the diameter d of the flat part 112 has a diameter ratio of 1:0.5 to 1:0.98 with respect to the diameter D of the flange part 111. More preferably, the diameter d of the flat part 112 may have an optimal diameter ratio of 1:0.75 with respect to the diameter D of the flange part 111 in order to maximize the contact area with the solder paste 220 by the step part 114 and prevent the solder paste 220 from being introduced into the outer circumferential surface of the connection pin 120.

In addition, the flange part 111 and the flat part 112 that constitute the head part 110 may have different thicknesses T and t, wherein it is preferable that the thickness t of the flat part 112 is thicker than that T of the flange part 111.

The reasons why the flat part 112 should have a thicker thickness than the flange part 111 are: to expand the area where the solder paste 220 surrounding the head part 110 contacts the side surface of the flat part 112 when mounting the head part 110 on the package substrate 200; and thereby, to allow the connection pin 120 to be vertically and easily installed on the package substrate 200 and to improve a bonding performance due to the expansion in the contact area of the side surface of the flat part 112 that is formed having a thicker thickness than the flange part 111.

At this time, the bottom surface of the flange part 111 contacts the side surface of the flat part 112 during the reflow process to function as a stopper to prevent the bulge phenomenon. When the flat part 112 has a thickness ratio of 1:1.5 with respect to the flange part 111, it may have an optimal bonding efficiency with the solder paste during the reflow process.

In addition, the flange part 111 that is formed on the flat part 112 functions as a stopper to prevent the solder paste 220 contacting the side surface of the flat part 112 from being discharged to the upper portion of the head part 110. The flange part 111 may have a thickness thin enough to prevent the discharge path of the solder paste 220.

Meanwhile, the bottom surface of the flat part 112 of the head part 110 is directly in contact with the pad part 210 of the package substrate 200. If the flat part 112 has a larger diameter, it can be stably mounted on the package substrate 200, without being inclined. The flat part 112 has a variable diameter in consideration of the projected height, diameter, and the like of the connection pin 120.

In other words, if the flat part 112 has a larger diameter, it can be stably mounted, whereas if the flat part 112 has a smaller diameter, the width of the step part 114 becomes larger, thereby making it possible to improve the effects to prevent the solder paste 220 from being discharged to the upper portion of the flange part 111.

Therefore, the diameter d of the flat part 112 may be varied with respect to the diameter S of the connection pin 120 of which diameter is set according to standards of electronic components. Therefore, the diameter d of the flat part 112 may have a diameter ratio of 1:1.1 to 1:4 with respect to the diameter of the connection pin 120.

At this time, when the diameter ratio of the flat part 112 and the connection pin 120 is 1:1.1 or less, similar to the diameter ratio of the flange part 111 described above, it is very difficult to substantially manufacture the flat part 112 having the diameter ratio and the area where the bottom surface of the flat part 112 contacts the pad part 210 becomes small so that the connection pin may be mounted to be inclined. Further, when external force is applied to the connection pin 120 after the reflow process, stress that can be transferred through the solder paste 220 is concentrated on only some points, such that the connection pin 120 may be easily broken or damaged due to fatigue load.

In addition, when the diameter ratio of the flat part 112 and the connection pin 120 is 1:4 or more, the width of the step part 114 is extremely narrow or the flat part 112 is formed to be larger than the diameter of the flange part 111, such that the flange part 111 cannot properly function as a stopper for the melted solder paste 220 but the solder paste is introduced into the connection pin 120 on the flat part 112, thereby degrading the effects to prevent the bulge phenomenon that the solder paste bulges along the connection pin 120. Further, the area where the step part 114 as well as the side surface of the flat part 112 are bonded to the solder paste 220 is reduced and thus the solder paste 220 can be bonded only to the end side of the round part 113 formed on the flat part 112, such that bonding strength with the solder paste is significantly degraded.

Therefore, the lead pin 100 is designed not to be inclined when being mounted on the pad part 210 of the package substrate 200 and to have an optimal diameter ratio, in consideration of the diameter d of the flat part 112 and the width of the step part 114 that can secure a maximum contact area. If the connection pin 120 is determined to have a diameter S of 0.3 mm according to the recent standards of the connection pin 120, it is most preferable that the diameter ratio of the connection pin 120 and the flat part 112 is 1:2.25.

In addition, the round part 113 in a convex type, having a predetermined curved surface, is formed on the bottom surface of the flat part 112.

The round part 113 serves to improve bonding reliability by expanding the contact area with the solder paste 220 surrounding the flat part 112. The round part 113 is configured to have two different radii of curvature so that voids that may be generated within the solder paste 220 can be easily discharged laterally along the curved surface, wherein each radius of curvature may be formed at a ratio of 1:0.1 to 1:5 with respect to the diameter S of the connection pin 120.

At this time, the radius of curvature may also have the same radius of curvature with respect to the entire curved surfaces of the round part.

The lead pin 100 according to the present embodiment constituted as above may be mounted in plural on the pad part 210 of the package substrate 200 on which wiring patterns are formed, while having equivalent intervals, such that it is mounted on the solder paste 220 printed on the pad part 210.

At this time, the lead pin 100 is disposed on the pad part 210 so that its head part 110 is projected downward and its connection pin 120 is projected upward, and the solder paste 220 is positioned between the head part 110 and the pad part 210.

The solder paste 220, made of an alloy of lead, zinc, and silver, is melted in a liquid-phase form having viscosity by applying heat and is cured in a melted-state shape by a normal temperature cooling, wherein the objects to be bonded are bonded each other in a cured state.

The solder paste 220 applied between the head part 110 and the pad part 210 is melted through an annealing process for melting the solder paste 220, that is, a reflow process, to allow the lead pin 100 to be bonded onto the package substrate 200.

Voids may be generated in the solder paste by abrupt melting when the solder paste 220 is melted during the reflow process, however, they are discharged laterally to the head part 110 along the curved surface of the round part 113 formed on the flat part 112 that constitutes the head part 110. Therefore, the lead pin 100 can be vertically coupled onto the package substrate 200 without being inclined.

Further, when the solder paste 220 surrounding the head part 110 is melted during the reflow process, the melted paste bulges along the upper portion of the object to be bonded. However, the bulge phenomenon of the solder paste 220 in contact with the bottom surface and side surface of the flat part 112 is prevented by the flange part 111 having a larger diameter than that of the flat part 112.

In other words, the flange part 111 functions as a stopper to prevent the flow path of the solder paste 220 melted between the flat part 112 and the pad part 210 of the package substrate 200.

FIG. 8 is a side view of a lead pin for a package substrate according to another embodiment of the present invention, and FIG. 9 is a side cross-sectional view showing a configuration where a lead pin according to another embodiment of the present invention is mounted on a package substrate.

As shown in the drawings, a lead pin 300 for the package substrate according to the present embodiment is configured to include a head part 310 that has a step part 314 formed on the upper portion of the head part 310 and a round part 312 formed on the lower portion of the head part 310, and a connection pin 320 that is projected upward from the head part 310.

The head part 310 is formed in a disk shape on one end of the connection pin 320, wherein a flat part 311 having a smaller diameter than that of the head part 310 is formed on the top surface of the head part 310, and a round part 312 having a predetermined radius of curvature is formed on the bottom surface of the head part 310.

At this time, the step part 314 is formed due to the difference in diameters of the disk shaped head part 310 and the flat part 311, having different diameters. Therefore, the diameter of the flat part 311 is smaller than that of the head part 310 formed in a disk shape on the bottom surface of the flat part 311, such that the step part 314 is formed on the portion where the side surface of the flat part 311 is connected to the top surface of the head part 310.

Further, the head part 310 has the round part 312 that is formed over the bottom surface, thereby making it possible to discharge voids formed in the solder paste 220 through the curved surface of the round part 312.

Although some of the solder paste 220 contacting the round part 312 of the head part 310 are discharged to the upper portion of the flat part 311 to be bonded, the lead pin 300 according to the present embodiment constituted as above can have a maximum contact area with the solder paste 220 through the round part 312 having a round surface formed on the side surface and bottom surface of the head part 310, thereby making it possible to provide maximum bonding performance of the lead pin 300.

At this time, with the lead pin 300 according to the present embodiment, it is preferable that the round part 312 has two different radii of curvature R1 and R2, similar to the lead pin 100 according to the aforementioned embodiment. The round part 312 may have a curved surface having the same radius of curvature with respect to the entire curved surfaces of the outer circumferential surface of the round part 312 in some cases.

According to the present invention, when the lead pin for the package substrate is mounted on the package substrate, the bulge phenomenon of the solder paste that surrounds the head part and is melted is prevented by the flange part, thereby making it possible to prevent the connection pin from being polluted and to improve a contact defect such as a short defect or the like when coupling a socket.

In addition, the voids included in the solder paste melted between the head part and the package substrate can be easily discharged to the outside along the curved surface of the round part, thereby making it possible to prevent the lead pin from being inclined due to the expansion of the voids.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the appended claims and their equivalents.

What is claimed is:

1. A lead pin for a package substrate, comprising:
   a cylindrical connection pin; and
   a head part that is formed on one end of the connection pin and has a convex round part formed on the lower end of the head part, having a step part,
   wherein the head part includes a flat part that has a round part formed on the bottom surface of the flat part and a flange part that has a larger diameter than that of the flat part, and the step part is formed at the portion in which the side surface of the flat part is connected to the bottom surface of the flange part, and
   wherein the round part has an outer circumferential surface which has two different radii of curvature length, which are selected in the range of 1:0.1 to 1:5 with respect to the diameter of the connection pin.

2. The lead pin for the package substrate according to claim 1, wherein two radii of curvature formed on the round part are the same length.

* * * * *